United States Patent
Li et al.

(10) Patent No.: US 10,746,776 B2
(45) Date of Patent: Aug. 18, 2020

(54) NON-METAL POSITION SENSOR FOR USE IN ELECTROMAGNETIC COMPATIBILITY TEST, AUTOMATIC ANTENNA POSITIONING DEVICE AND SYSTEM

(71) Applicant: GUANGZHOU CHANGEN ELECTRONIC TECHNOLOGY CO., LTD, Guangdong (CN)

(72) Inventors: Nan Li, Guangdong (CN); Jun Li, Guangdong (CN)

(73) Assignee: GUANGZHOU CHANGEN ELECTRONIC TECHNOLOGY CO., LTD, Guangdong (CN)

( * ) Notice: Subject to any disclaimer, the term of this patent is extended or adjusted under 35 U.S.C. 154(b) by 182 days.

(21) Appl. No.: 16/067,821

(22) PCT Filed: Dec. 30, 2016

(86) PCT No.: PCT/CN2016/113877
§ 371 (c)(1),
(2) Date: Jul. 3, 2018

(87) PCT Pub. No.: WO2017/118359
PCT Pub. Date: Jul. 13, 2017

(65) Prior Publication Data
US 2019/0025359 A1    Jan. 24, 2019

(30) Foreign Application Priority Data
Jan. 4, 2016 (CN) .......................... 2016 1 0009777

(51) Int. Cl.
*G01R 31/00* (2006.01)
*G01B 13/00* (2006.01)
(Continued)

(52) U.S. Cl.
CPC ........ *G01R 31/001* (2013.01); *F15B 15/1423* (2013.01); *G01B 13/00* (2013.01); *H01Q 1/125* (2013.01); *H01Q 1/22* (2013.01)

(58) Field of Classification Search
CPC .... G01R 33/07; G01R 33/072; G01R 31/001; G01R 1/04; G01R 29/0878;
(Continued)

(56) References Cited

U.S. PATENT DOCUMENTS 3,747,113 A * 7/1973 De Vellis ................. H01Q 1/08
343/766
3,837,354 A    9/1974 Farr
(Continued)

FOREIGN PATENT DOCUMENTS

CN    102569981 A    7/2012
CN    105428783       3/2016
(Continued)

OTHER PUBLICATIONS

State Intellectual Property Office of the P.R. China; Mar. 15, 2017.

*Primary Examiner* — Vinh P Nguyen
(74) *Attorney, Agent, or Firm* — Patshegen IP LLC; Moshe Pinchas

(57) ABSTRACT

Provided are a non-metallic position sensor for electromagnetic compatibility testing, a device and a system for automatic antenna positioning. The non-metallic position sensor includes a cylinder body, a piston, and a piston rod; a side wall of a cylinder body lower chamber is provided with a first radial air hole, a second radial air hole arranged on the lower end of the first radial air hole, and a third radial air hole arranged axially symmetrically with the first radial air hole; when the piston rod moves to a first position, the first radial air hole is communicated with the third radial air hole, the non-metallic position sensor send a first air pressure signal outwards; when the piston rod moves to a second
(Continued)

US 10,746,776 B2

Page 2 position, the first radial air hole is communicated with the second radial air hole, the non-metallic position sensor send a second air pressure signal outwards.

12 Claims, 4 Drawing Sheets

(51) Int. Cl.
*F15B 15/14* (2006.01)
*H01Q 1/12* (2006.01)
*H01Q 1/22* (2006.01)

(58) Field of Classification Search
CPC .. G01R 33/0354; F15B 15/1423; F15B 15/06; F15B 15/1428; F15B 15/1461; F15B 15/28; F15B 2215/305; G01B 13/00; H01Q 1/125; H01Q 1/1257; H01Q 1/22
See application file for complete search history.

(56) References Cited

U.S. PATENT DOCUMENTS

| | | | |
|---|---|---|---|
| 8,537,064 B2* | 9/2013 | Huang | G01R 31/002 343/766 |
| 2003/0160731 A1* | 8/2003 | Wensink | H01Q 1/125 343/892 |
| 2005/0168385 A1* | 8/2005 | Baker | G06K 7/10316 343/700 MS |
| 2015/0233399 A1* | 8/2015 | Arntzen | F15B 1/24 92/5 R |
| 2019/0006750 A1* | 1/2019 | Li | G01R 29/0878 |

FOREIGN PATENT DOCUMENTS

| | | |
|---|---|---|
| CN | 105485084 | 4/2016 |
| CN | 105572506 | 5/2016 |
| CN | 205388061 | 7/2016 |
| CN | 205452523 | 8/2016 |
| CN | 205539222 | 8/2016 |

* cited by examiner

US 10,746,776 B2

NON-METAL POSITION SENSOR FOR USE IN ELECTROMAGNETIC COMPATIBILITY TEST, AUTOMATIC ANTENNA POSITIONING DEVICE AND SYSTEM

CROSS-REFERENCE TO RELATED APPLICATIONS

This application claims the benefit of priority to Chinese Patent Application No. 201610009777.3, filed on Jan. 4, 2016, and entitled "NON-METALLIC POSITION SENSOR FOR ELECTROMAGNETIC COMPATIBILITY TESTING, DEVICE AND SYSTEM FOR AUTOMATIC ANTENNA POSITIONING", which disclosures are herein incorporated by reference.

TECHNICAL FIELD

The present disclosure relates to corollary equipment for electromagnetic compatibility testing and particularly to a non-metallic position sensor for electromagnetic compatibility testing, a device and a system for automatic antenna positioning.

BACKGROUND

When conducting electromagnetic interference (EMI) testing, an antenna mount is needed to hold up an antenna to test a test object. If a test distance between the test object and the antenna is determined by an operator positioning the antenna mount manually every time, it not only has low efficiency, but also is easy to position improperly, so as to affect the accuracy of the test.

SUMMARY

To address the deficiency of the existing technology, the present disclosure provides a non-metallic position sensor for electromagnetic compatibility testing, a device and a system for automatic antenna positioning.

A first aspect of the present disclosure provides a non-metallic position sensor for electromagnetic compatibility testing, which comprises: a cylinder body, a piston placed in the cylinder body, and a piston rod whose one end is fixedly connected with the piston; the cylinder body comprises a cylinder body upper chamber and a cylinder body lower chamber; a side wall of the cylinder body lower chamber is provided with a first radial air hole, a second radial air hole arranged on the lower end of the first radial air hole, and a third radial air hole arranged on the same horizontal plane as the first radial air hole;

a portion of the piston rod combined with the inner wall of the cylinder body lower chamber is provided with a first seal ring and a second seal ring in sequence from top to bottom, and the piston rod is provided with a breather pipe internally; an axial distance between the first seal ring and the second seal ring is equal to an axial distance between the first radial air hole and the second radial air hole; the first seal ring, the second seal ring, and the inner chamber of the cylinder body lower chamber is sealed and in clearance fit; and the first seal ring is provided with a first radial through hole, the second seal ring is provided with a second radial through hole.

Furthermore, the first radial air hole and the third radial air hole are axially symmetrically arranged.

Furthermore, the breather pipe is an I-shaped breather pipe.

Furthermore, the first radial air hole is communicated with the third radial air hole when the piston rod moves to a first position.

Furthermore, one of the first radial air hole and the third radial air hole is an air inlet hole, and the other is an air outlet hole; wherein the air inlet hole is connected with an external air inlet device and the air outlet hole is connected with an external gas-electric conversion device.

Furthermore, the air outlet hole sends the first air pressure signal to the outside when the first radial air hole is communicated with the third radial air hole.

Furthermore, the end of the cylinder body upper chamber is provided with an axial air inlet hole, external airflow enters the cylinder body through the axial air hole and pushes the piston rod to move downward relative to the cylinder body; when the piston rod moves to a second position, a pipe mouth of the breather pipe, the first radial through hole, and the first radial air hole are communicated with each other, the other pipe mouth of the breather pipe, the second radial through hole, and the second radial air hole are communicated with each other, that is, the first radial air hole is communicated with the second radial air hole.

It can be understood that, the first seal ring and the second seal ring can be arranged on the inner wall of the cylinder body lower chamber, and the first radial through hole is communicated with the first radial air hole, the second radial through hole is communicated with the second radial air hole.

Optionally, one of the first radial air hole and the second radial air hole is an air inlet hole, and the other is an air outlet hole; wherein the air inlet hole is connected with an external air inlet device and the air outlet hole is connected with an external gas-electric conversion device.

Optionally, the air outlet hole sends the second air pressure signal to the outside when the first radial air hole is communicated with the second radial air hole.

Furthermore, a portion of the piston combined with the inner wall of the cylinder body upper chamber is provided with a third seal ring, the third seal ring and the inner chamber of the cylinder body upper chamber are sealed and in clearance fit; the inner wall of the cylinder body lower chamber is provided with a fourth seal ring and a fifth seal ring in sequence from top to bottom; one end of the piston rod is fixedly connected with the piston through a through hole formed on the fourth seal ring, the piston rod and the fourth seal ring are sealed and in clearance fit, and the other end passes through a through hole formed on the fifth seal ring, the piston rod and the fifth seal ring are sealed and in clearance fit.

Furthermore, the end of the cylinder body upper chamber is provided with an axial air inlet hole, external airflow enters the cylinder body through the axial air hole and pushes the piston rod to move downward relative to the cylinder body.

Furthermore, all components of the non-metallic position sensor used for electromagnetic compatibility testing are made of non-metallic materials. For example, the annular sealing elements can be rubber pistons A second aspect of the present disclosure provides a device for automatic antenna positioning, which comprises an adapting piece, a rotary sleeve arranged on the adapting piece, an antenna arranged in the rotary sleeve, and a non-metallic position sensor as described in the first aspect of the present disclosure which is arranged on the adapting piece; wherein the adapting piece further comprises: a hollow cavity, a first mounting hole arranged inside the cavity and penetrating upper and lower surfaces of the adapting piece, and a second mounting hole arranged on the periphery of the cavity and penetrating upper and lower surfaces of the adapting piece;

the antenna is mounted in the first mounting hole with the rotary sleeve arranged outside, at least one end of the antenna extends out of the first mounting hole; wherein the rotary sleeve comprises an inner sleeve fixedly connected with the antenna, and an outer sleeve arranged outside of the inner sleeve; a surface of the inner sleeve near the outer sleeve is provided with an axial sliding slot, a surface of the outer sleeve near the inner sleeve is provided with a slider which is matched with the sliding slot and is placed in the sliding slot.

Furthermore, the slider can move vertically along the sliding slot, optionally, a range of the movement can be defined according to the size of specific products, for instance, the range of the movement being 21 mm.

Furthermore, the length of the sliding slot is less than or equal to the height of the cavity. In this way, when the antenna touches the test object, the antenna and the inner sleeve fixedly connected to the antenna stop moving, while the adapting piece and the outer sleeve of the rotary sleeve can continue to move a distance, that is, the antenna can move up and down relative to the adapting piece.

Furthermore, at least one end of the antenna extends out of the first mounting hole as a detecting end. When testing, the detecting end of the antenna touches the test object, which is configured to detect the test object.

Furthermore, the cylinder body of the non-metallic position sensor is arranged into the second mounting hole of the adapting piece, and one end of the piston rod of the non-metallic position sensor extends out of the second mounting hole.

Furthermore, the antenna is configured to detect that one end of the test object is connected with the end of the piston rod of the non-metallic position sensor extending out of the second mounting hole through a connecting plate; the axial direction of the antenna is the same as the axial direction of the piston rod of the non-metallic position sensor, and an axial distance between the end of the piston rod extending out of the second mounting hole and the test object is equal to an axial distance between the end of the antenna and the test object.

Furthermore, the antenna drives the piston rod of the non-metallic position sensor to rise relative to the cylinder body when the antenna rises relative to the adapting piece; and the first radial air hole is communicated with the third radial air hole when the antenna rises to a first position relative to the adapting piece.

Furthermore, the device for automatic antenna positioning further comprises an antenna mount and a connecting arm connected to the antenna mount, wherein the adapting piece is connected to the connecting arm.

A third aspect of the present disclosure provides a system for automatic antenna positioning, which comprises a device for automatic antenna positioning as described in the second aspect of the present disclosure, the system further comprises a gas-electric conversion device connected with the non-metallic position sensor of the device for automatic antenna positioning, a position control device connected with the gas-electric conversion device; wherein the non-metallic position sensor of the antenna mount is configured to send a first air pressure signal to the gas-electric conversion device when the first radial air hole is communicated with the third radial air hole; the gas-electric conversion device is configured to convert the received first air pressure signal to a first electric signal and send the first electric signal to the position control device; and the position control device is configured to determine that the non-metallic position sensor and/or the antenna effectively touches a test object when receiving the first electric signal sent by the gas-electric conversion device.

Furthermore, the system for automatic antenna positioning further comprises a first gas delivery device, and the position control device is configured to: send air supply instruction to the first gas delivery device when the piston rod of the non-metallic position sensor and/or the antenna effectively touches the test object; the first gas delivery device is configured to: when receiving air supply instruction sent by the position control device, supply gas to the cylinder of the non-metallic position sensor, the airflow enters the cylinder body through the axial air hole at the end of the cylinder body upper chamber and pushes the piston rod to reset, and then drives the antenna to reset.

Furthermore, the end of the cylinder body upper chamber is provided with an axial air inlet hole, external airflow enters the cylinder body through the axial air hole and pushes the piston rod to move downward relative to the cylinder body; when the piston rod moves to a second position, a pipe mouth of the breather pipe, the first radial through hole, and the first radial air hole are communicated with each other, the other pipe mouth of the breather pipe, the second radial through hole, and the second radial air hole are communicated with each other, that is, the first radial air hole is communicated with the second radial air hole.

Furthermore, the non-metallic position sensor is configured to send a second air pressure signal to the gas-electric conversion device when the first radial air hole is communicated with the third radial air hole; and the gas-electric conversion device is configured to: convert the received second air pressure signal to a second electric signal and send the second electric signal to the position control device; and the position control device is configured to: determine that the non-metallic position sensor completes reset, and determine that the antenna can enter a test state, when receiving the second electric signal sent by the gas-electric conversion device.

Furthermore, the system for automatic antenna positioning further comprises a second gas delivery device, the second gas delivery device is configured to supply gas to the cylinder body lower chamber of the non-metallic position sensor. Optionally, the second gas delivery device can supply gas to the cylinder body lower chamber of the non-metallic position sensor through the first radial air hole or the third radial air hole. Optionally, the second gas delivery device can supply gas to the cylinder body lower chamber of the non-metallic position sensor through the first radial air hole or the second radial air hole.

A fourth aspect of the present disclosure provides applications of the non-metallic position sensor as described in the first aspect, the device for automatic antenna positioning as described in the second aspect, or the system for automatic antenna positioning as described in the third aspect, in electromagnetic compatibility testing.

Advantageous effects are provided by the present disclosure, that is: the non-metallic position sensor provided by the present disclosure for electromagnetic compatibility testing is a pneumatic position sensor, and is completely non-metallic material, which avoids electromagnetic interference of a test device to a test area to the maximum extent. The device for automatic antenna positioning provided by the present disclosure has the characteristics of simple assembly, high measurement accuracy and strong reliability; the system for automatic antenna positioning provided by the present disclosure can realize automatic detection and automatic control.

DETAILED DESCRIPTION OF ILLUSTRATED EMBODIMENTS

Figure 1:
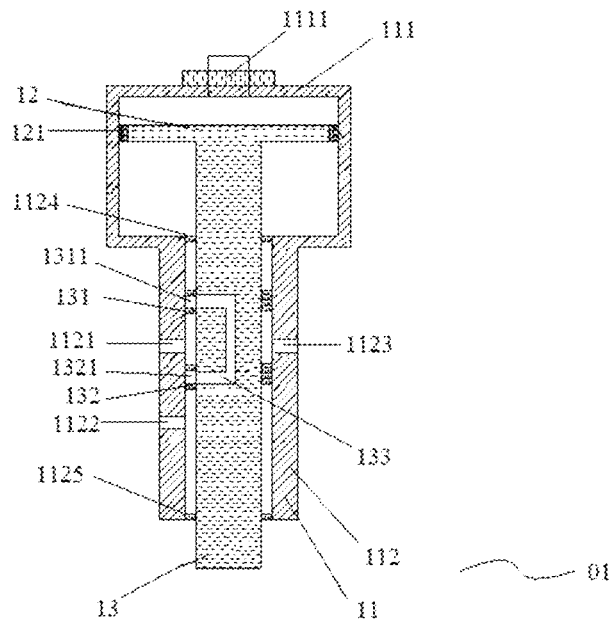
FIG. 1 is a s sectional view illustrating a non-metallic position sensor 01 for electromagnetic compatibility testing of state 1 according to an embodiment of the present disclosure.

The following further describes the present disclosure with reference to the accompanying drawings and specific embodiments, the illustrative embodiments and descriptions therein are only used to explain the present disclosure, but are not intended to limit the present disclosure.

What should be noted is, in the disclosure, the technical words "first", "second" are only be used for a descriptive purpose, and are not to be understood to indicate or imply the relative importance or imply the number of the indicated technical features. Therefore, features defined with "first", "second" may include one or more of the features explicitly or implicitly. In the description of the disclosure, "multiple" means two or more than two, unless specifically defined otherwise.

In the disclosure, the technical words "the first position", "the second position" should be understood in generalization. For example, it could be a location point, or an activity area.

In the disclosure, the technical words "move down", "move up", "rise" or "decline" et al. should be understood in generalization. For example, the first feature "moves down", "moves up", "rises" or "declines" relative to the second feature could represents the first feature moves in the direction of the first position of the second feature relative to the second feature, or the first feature moves in the direction of the second position of the second feature relative to the second feature.

In the disclosure, the technical words "load", "install", "be linked to", "connect to", "fix" et al. should be understood in generalization, unless specifically defined otherwise. For example, these technical words are described as fixed joint or removable connection or the integration of the connection; or mechanical joint or electrical connection; or direct connection or indirect connection via the middle medium or internal connection between the two components. The skilled persons in the art can understand the specific meaning about these technical words in the disclosure according to the specific circumstance.

In the disclosure, unless specifically defined otherwise, the first feature being located on the second feature or under the second feature could disclose the direct connection between the first feature and the second feature, and could also disclose that the first feature is not directly connected to the second feature but adopts other ways to connect to the second feature. Furthermore, the first feature being located "above" and "on" the second feature means that the first feature is located right above the second feature or above the second feature, or only means that the horizontal height of the first feature is higher than that of the second feature. Also the first feature being located "under" and "below" the second feature means that the first feature is located right under the second feature or under the second feature, or only means that the horizontal height of the first feature is lower than that of the second feature.

Figure 2:
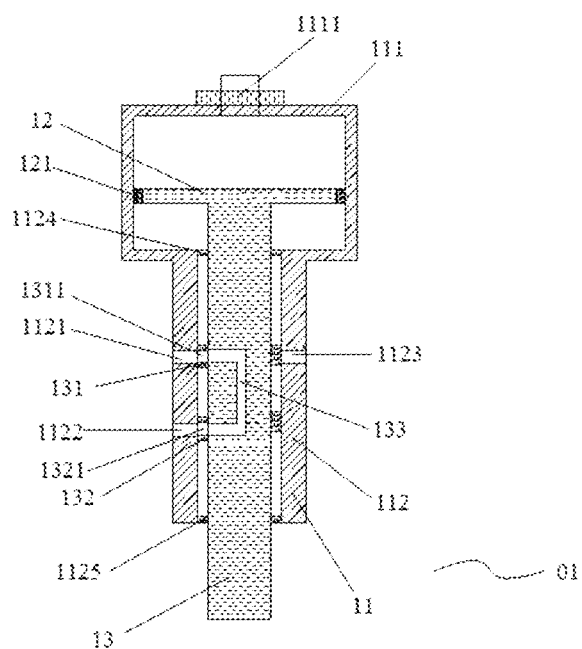
FIG. 2 is a s sectional view illustrating the non-metallic position sensor 01 for electromagnetic compatibility testing of state 2 according to an embodiment of the present disclosure.

Embodiment One a Non-Metallic Position Sensor for Electromagnetic Compatibility Testing FIG. 1 is a s sectional view illustrating a non-metallic position sensor 01 for electromagnetic compatibility testing of state 1 according to an embodiment of the present disclosure; FIG. 2 is a s sectional view illustrating the non-metallic position sensor 01 for electromagnetic compatibility testing of state 2 according to an embodiment of the present disclosure.

As shown in FIG. 1 and FIG. 2, the non-metallic position sensor 01 comprises a cylinder body 11, a piston 12 placed in the cylinder body 11, and a piston rod 13 whose one end is fixedly connected with the piston 12; the cylinder body 11 comprises a cylinder body upper chamber 111 and a cylinder body lower chamber 112; a side wall of the cylinder body lower chamber 112 is provided with a first radial air hole 1121, a second radial air hole 1122 arranged on the lower end of the first radial air hole 1121, and a third radial air hole 1123 arranged on the same horizontal plane as the first radial air hole 1121;

a portion of the piston rod 13 combined with the inner wall of the cylinder body lower chamber 112 is provided with a first seal ring 131 and a second seal ring 132 in sequence from top to bottom, and the piston rod 13 is provided with a breather pipe 133 internally; an axial distance between the first seal ring 131 and the second seal ring 132 is equal to an axial distance between the first radial air hole 1121 and the second radial air hole 1122; the first seal ring 131, the second seal ring 132, and the inner chamber of the cylinder body lower chamber 112 is sealed and in clearance fit; and the first seal ring 131 is provided with a first radial through hole 1311, the second seal ring 132 is provided with a second radial through hole 1321.

Furthermore, the first radial air hole 1121 and the third radial air hole 1123 are axially symmetrically arranged.

Furthermore, the breather pipe 133 is an I-shaped breather pipe.

Furthermore, the first radial air hole 1121 can be communicated with the third radial air hole 1123; the first radial air hole 1121 is communicated with the third radial air hole 1123 when the piston rod 13 moves to a first position.

Furthermore, one of the first radial air hole 1121 and the third radial air hole 1123 is an air inlet hole, and the other is an air outlet hole; wherein the air inlet hole is connected with an external air inlet device and the air outlet hole is connected with an external gas-electric conversion device.

Furthermore, the non-metallic position sensor 01 (the air outlet hole of the first radial air hole 1121 and the third radial air hole 1123) sends the first air pressure signal to the outside when the first radial air hole 1121 is communicated with the third radial air hole 1123.

Furthermore, the end of the cylinder body upper chamber 111 is provided with an axial air inlet hole 1111, external airflow enters the cylinder body 11 through the axial air hole 1111 and pushes the piston rod 13 to move downward relative to the cylinder body 11; the first radial air hole 1121, the second radial air hole 1122, the first radial through hole 1311, and the second radial through hole 1321 can be communicated with each other through a breather pipe 133; when the piston rod 13 moves to a second position, a pipe mouth of the breather pipe 133, the first radial through hole 1311, and the first radial air hole 1121 are communicated with each other, the other pipe mouth of the breather pipe 133, the second radial through hole 1321, and the second radial air hole 1122 are communicated with each other, that is, the first radial air hole 1121 is communicated with the second radial air hole 1122.

Optionally, the airflow of the first external air inlet device entering the second cylinder body 11 through the axial air hole 1111 is controlled by an external control device. The external control device presets an airflow parameter, by which controls the airflow of the second cylinder body 11, which can just push the piston rod 13 to move downward relative to the second cylinder body 11 and let the first radial air hole 1121 communicated with the second radial air hole 1122.

Optionally, one of the first radial air hole 1121 and the second radial air hole 1122 is an air inlet hole, and the other is an air outlet hole; wherein the air inlet hole is connected with an external air inlet device and the air outlet hole is connected with an external gas-electric conversion device. When the first radial air hole 1121 is communicated with the second radial air hole 1122, the non-metallic position sensor 01 (the air outlet hole of the first radial air hole 1121 and the second radial air hole 1122) is configured to send a second air pressure signal to the outside, and when the external gas-electric conversion device receives the second air pressure signal, the external gas-electric conversion device converts the second air pressure signal to a second electric signal and send the second electric signal to the external control device; the external control device determines that the piston rod 13 moves downwards relative to the second cylinder body 11 to conduct the first radial air hole 1121 and the second radial air hole 1122, and controls the first external air inlet device to stop gas supply to the axial air hole 1111.

It can be understood that, the airflow through the axial air hole 1111 into the second cylinder body 11 can reset the piston rod 13 from state 1 shown in FIG. 1 to the state 2 shown in FIG. 2.

It can be understood that, as shown in FIG. 1 of state 1, the piston rod 13 moves to the first position in the inner cavity of the cylinder body 11, the first radial air hole 1121 communicated with the third radial air hole 1123. As shown in FIG. 2 of state 2, the piston rod 13 moves to the second position in the inner cavity of the cylinder body 11, the first radial through hole 1311 and the first radial through hole 1312 are respectively located at positions corresponding to the first radial air hole 1121 and the second radial air hole 1122, the first radial air hole 1121 communicated with the second radial air hole 1122 through the breather pipe 133.

Furthermore, a portion of the piston 12 combined with the inner wall of the cylinder body upper chamber 111 is provided with a third seal ring 121, the third seal ring 121 and the inner chamber of the cylinder body upper chamber 111 are sealed and in clearance fit; the inner wall of the cylinder body lower chamber 112 is provided with a fourth seal ring 1124 and a fifth seal ring 1125 in sequence from top to bottom; one end of the piston rod 13 is fixedly connected with the piston 12 through a through hole formed on the fourth seal ring 1124, the piston rod 13 and the fourth seal ring 1124 are sealed and in clearance fit, and the other end passes through a through hole formed on the fifth seal ring 1125, the piston rod 13 and the fifth seal ring 1125 are sealed and in clearance fit.

It can be understood that, in this implementation, the fourth seal ring 1124 divides the cylinder body 11 into the cylinder body upper chamber 111 and the cylinder body lower chamber 112.

Specifically, all components of the non-metallic position sensor 01 used for electromagnetic compatibility testing are made of non-metallic materials. For example, the annular sealing elements can be rubber pistons, which can avoid interference to electromagnetic compatibility testing.

It can be understood that, the terms "up" and "down" in the present disclosure do not represent an absolute space. For example, if the position of the axial air inlet hole 1111 provided on one end of the cylinder body 11 is marked as "up", and the position of the fifth seal ring 1125 provided on the other end of the cylinder body 11 is marked as "down", the spatial relationship of the other components of the non-metallic position sensor 01 can be marked based on the above-mentioned standard.

It can be understood that, in state 1 shown in FIG. 1, when the first radial air hole 1121 is communicated with the third radial air hole 1123, one of the first radial air hole 1121 and the third radial air hole 1123 is an air inlet hole, and the other is an air outlet hole; in state 2 shown in FIG. 2, when the first radial air hole 1121 is communicated with the second radial air hole 1122, one of the first radial air hole 1121 and the second radial air hole 1122 is an air inlet hole, and the other is an air outlet hole.

It can be understood that, in state 1 shown in FIG. 1, when the antenna mount is used, the first external air inlet device controls airflow through the axial breather hole 1111 into the cylinder body 11 and pushes the piston rod 13 to move downwards relative to the cylinder body 11, when the piston rod 13 moves to the position of state 2, the first radial air hole 1121 is communicated with the second radial air hole 1122, and compressed air flows through the first radial air hole 1121 and the second radial hole 1122. Optionally, the switchover between state 1 shown in FIG. 1 and state 2 shown in FIG. 2 can be realized by an external control device controlling an air inlet volume of the first external air inlet device. Optionally, the switchover between state 1 shown in FIG. 1 and state 2 shown in FIG. 2 can be realized by the following signal feedback: when the first radial air hole 1121 is communicated with the second radial air hole 1122, the first radial air hole 1121 or the second radial air hole 1122 ejects a second air pressure to the outside, and the second air pressure triggers a micro-switch of the external gas-electric conversion device, the external gas-electric conversion device converts the second air pressure signal to a second electric signal, which represents that the entire device returns to a state to be measured.

When the tail end of the piston rod 13 touches the test object, the piston rod 13 moves upwards relative to the cylinder body 11, when the piston rod 13 moves upwards to the position of state 1 (as shown in FIG. 1), the first radial air hole 1121 is communicated with the third radial air hole 1123, compressed air flows through the first radial air hole 1121 and the third radial hole 1123, and ejects a first air pressure outwards, which will triggers the micro-switch of the external gas-electric conversion device, the external gas-electric conversion device converts the air pressure signal to a first electric signal, which represents that the tail end of the piston rod 13 has effectively touched the test object.

The non-metallic position sensor provided by the present disclosure has the characteristics of simple assembly, high measurement accuracy and strong reliability.

Embodiment Two a Device for Automatic Antenna Positioning

Figure 3:
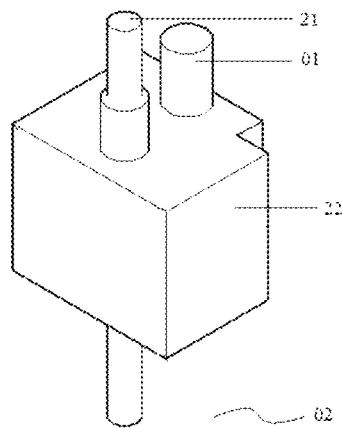
FIG. 3 is a schematic structure diagram illustrating a device 02 for automatic antenna positioning according to an embodiment of the present disclosure.
Figure 4:
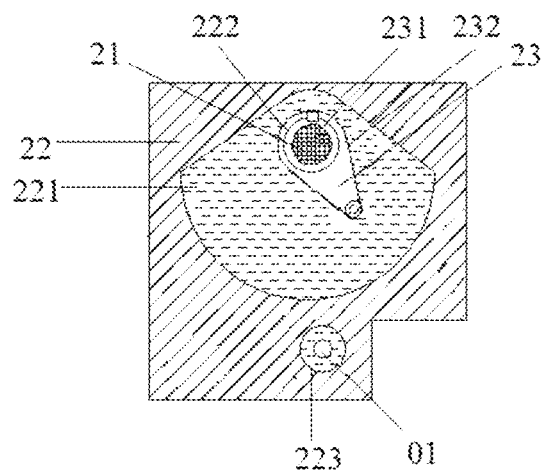
FIG. 4 is a sectional view illustrating the device 02 for automatic antenna positioning according to an embodiment of the present disclosure.
Figure 5:
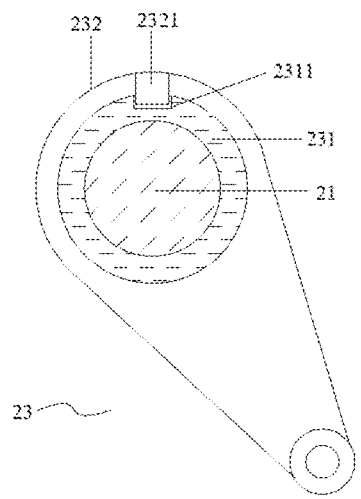
FIG. 5 is a schematic connection diagram of an antenna 21 and a rotary sleeve 23 according to an embodiment of the present disclosure.

FIG. 3 is a schematic structure diagram illustrating a device 02 for automatic antenna positioning according to an embodiment of the present disclosure; FIG. 4 is a sectional view illustrating the device 02 for automatic antenna positioning according to an embodiment of the present disclosure; FIG. 5 is a schematic connection diagram of an antenna 21 and a rotary sleeve 23 according to an embodiment of the present disclosure.

As shown in FIG. 3, FIG. 4, and FIG. 5, in an implementation of the present disclosure, a device 02 for automatic antenna positioning provided by the present disclosure comprises an adapting piece 22, a rotary sleeve 23 arranged on the adapting piece 22, an antenna 21 arranged in the rotary sleeve 23, and a non-metallic position sensor 01 as described in the first aspect of the present disclosure which is arranged on the adapting piece 22; wherein the adapting piece 22 further comprises: a hollow cavity 221, a first mounting hole 222 arranged inside the cavity 221 and penetrating upper and lower surfaces of the adapting piece 22.

Specifically, the antenna 21 is mounted in the first mounting hole 222 with the rotary sleeve 23 arranged outside, at least one end of the antenna 21 extends out of the first mounting hole 222; wherein the rotary sleeve 23 comprises an inner sleeve 231 fixedly connected with the antenna 21, and an outer sleeve 232 arranged outside of the inner sleeve 231; a surface of the inner sleeve 231 near the outer sleeve 232 is provided with an axial sliding slot 2311, a surface of the outer sleeve 232 near the inner sleeve 231 is provided with a slider 2321 which is matched with the sliding slot 2311 and is placed in the sliding slot 2311.

Specifically, the slider 2321 can move vertically along the sliding slot 2311, optionally, the slider 2321 can move vertically along the sliding slot 2311, a range of the movement can be defined according to the size of specific products, for instance, the range of the movement being 21 mm.

Specifically, the length of the sliding slot 2311 is less than or equal to the height of the cavity 221. In this way, when the antenna 21 touches the test object, the antenna 21 and the inner sleeve 231 fixedly connected to the antenna stop moving, while the adapting piece 22 and the outer sleeve 232 of the rotary sleeve 23 can continue to move a distance, that is, the antenna 21 can move up and down relative to the adapting piece 22, a range of the movement can be defined according to the size of specific products, for instance, the range of the movement being 21 mm.

At least one end of the antenna 21 extends out of the first mounting hole 222 as a detecting end. When testing, the detecting end of the antenna 21 touches the test object, which is configured to detect the test object.

Specifically, the adapting piece 22 further comprises a second mounting hole 223 arranged on the periphery of the cavity 221 and penetrating upper and lower surfaces of the adapting piece 22, the cylinder body 11 of the non-metallic position sensor 01 is arranged into the second mounting hole 223 of the adapting piece 22, and one end of the piston rod 13 of the non-metallic position sensor 01 extends out of the second mounting hole 223.

Specifically, the antenna 21 is configured to detect that one end of the test object is connected with the end of the piston rod 13 of the non-metallic position sensor 01 extending out of the second mounting hole 223 through a connecting plate; the axial direction of the antenna 21 is the same as the axial direction of the piston rod 13 of the non-metallic position sensor 01, and an axial distance between the end of the piston rod 13 extending out of the second mounting hole 223 and the test object is equal to an axial distance between the end of the antenna 21 and the test object.

Optionally, the external gas-electric conversion device is connected with y external control device and sends an electrical signal to the external control device. After acquiring the first electric signal, the external control device does not operate the instruction which makes the antenna further approach the test object, thereby preventing the antenna from being damaged due to excessive proximity to the test object.

Figure 6:
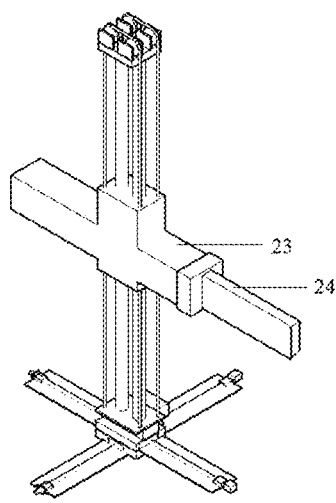
FIG. 6 is a schematic structure diagram illustrating an antenna mount 22 and a connecting arm 24 according to an embodiment of the present disclosure.

FIG. 6 is a schematic structure diagram illustrating an antenna mount and a connecting arm 24 according to an embodiment of the present disclosure.

As shown in FIG. 6, in another implementation of the present disclosure, the device 02 for automatic antenna positioning further comprises an antenna mount 23 and a connecting arm 24 connected to the antenna mount, wherein the adapting piece 22 is connected to the connecting arm 24.

It can be understood that, in state 1 shown in FIG. 1, when the antenna mount is used, the external air inlet device controls airflow through the axial breather hole 1111 into the cylinder body 11 and pushes the piston rod 13 to move downwards relative to the cylinder body 11; when the piston rod 13 moves to the position of state 2 in FIG. 2, the first radial air hole 1121 is communicated with the second radial air hole 1122, and compressed air flows through the first radial air hole 1121 and the second radial hole 1122 and ejects the second air pressure to the outside, and the second air pressure triggers a micro-switch of the external gas-electric conversion device, the external gas-electric conversion device converts the second air pressure signal to a second electric signal, which represents that the entire device returns to a state to be measured.

When the tail end of the piston rod 13 together with the end of the rotary sleeve 23 touch the test object, the connecting arm 24 drives the adapting piece 22 to continue to move to the test object, because the rotary sleeve 23 can perform a specific lifting movement relative to the adapting piece 22 (optionally, the slider 2321 can move vertically along the sliding slot 2311, the lifting range can be defined according to the size of specific products, such as, 21 mm), the piston rod 13 moves upwards relative to the cylinder body 11, when the piston rod 13 moves upwards to the position of state 1 (as shown in FIG. 1), the first radial air hole 1121 is communicated with the third radial air hole 1123, compressed air flows through the first radial air hole 1121 and the third radial hole 1123, and ejects a first air pressure outwards, which will triggers the micro-switch of the external gas-electric conversion device, the external gas-electric conversion device converts the first air pressure signal to a first electric signal, which represents that the antenna has effectively touched the test object.

The design of the present disclosure can effectively sense the effective touch of the antenna to the test object, and prevent the antenna from being damaged due to excessive proximity to the test object.

Embodiment Three a System for Automatic Antenna Positioning

Figure 7:
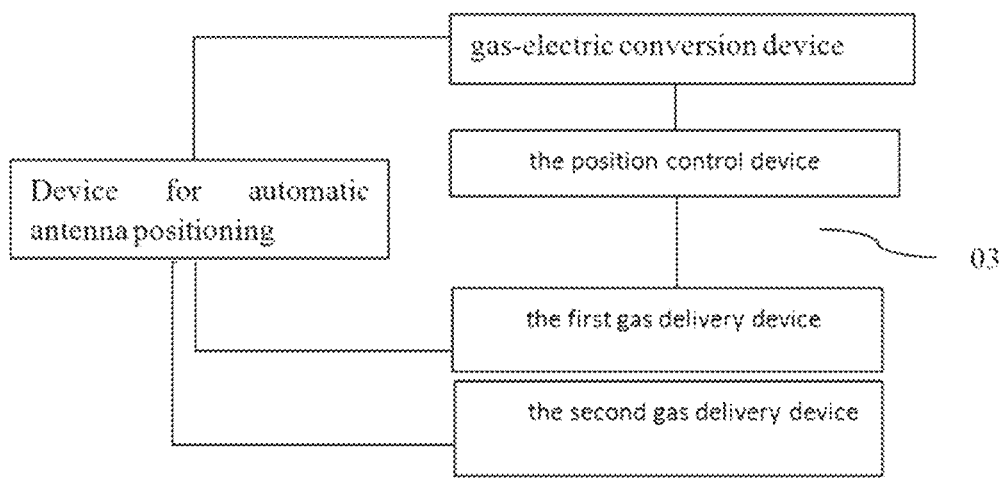
FIG. 7 is a schematic diagram illustrating a system 03 for automatic antenna positioning according to an embodiment of the present disclosure.

FIG. 7 is a schematic diagram illustrating a system 03 for automatic antenna positioning according to an embodiment of the present disclosure.

As shown in FIG. 7, the present disclosure provides a system 03 for automatic antenna positioning, which comprises a device 02 for automatic antenna positioning as described in the present disclosure, the system further comprises a gas-electric conversion device connected with the non-metallic position sensor 01 of the device 02 for automatic antenna positioning, a position control device connected with the gas-electric conversion device; wherein the non-metallic position sensor 01 of the antenna mount is configured to send a first air pressure signal to the gas-electric conversion device when the piston rod 13 of the non-metallic position sensor 01 in the device 02 for automatic antenna positioning moves to the first radial air hole 1121 and the third radial air hole 1123 to conduct; the gas-electric conversion device is configured to convert the received first air pressure signal to a first electric signal and send the first electric signal to the position control device;

the position control device is configured to determine that the piston rod 13 of the non-metallic position sensor 01 and/or the antenna 21 effectively touches a test object when receiving the first electric signal sent by the gas-electric conversion device.

In an implementation of the present disclosure, the system 03 for automatic antenna positioning provided by the third embodiment of the present disclosure further comprises a first gas delivery device, and the position control device is configured to: send air supply instruction to the first gas delivery device when the piston rod 13 of the non-metallic position sensor 01 and/or the antenna effectively touches the test object; the first gas delivery device is configured to: when receiving air supply instruction sent by the position control device, supply gas to the cylinder of the non-metallic position sensor 01, the airflow enters the cylinder body 11 through the axial air hole 1111 at the end of the cylinder body upper chamber 111 and pushes the piston rod 13 to reset, and then drives the antenna 21 to reset.

In an implementation of the present disclosure, the system 03 for automatic antenna positioning provided by the third embodiment of the present disclosure further comprises a second gas delivery device, the second gas delivery device is configured to supply gas to the cylinder of the non-metallic position sensor 01.

Furthermore, when the piston rod 13 declines relative to the cylinder body 11 to conduct the first radial air hole 1121 and the second radial air hole 1122, the non-metallic position sensor 01 sends the second air pressure signal to the gas-electric conversion device; the gas-electric conversion device is configured to: convert the second air pressure signal received into the second electric signal and send the second electric signal to the position control device; the position control device is configured to determine that the piston rod 13 of the non-metallic position sensor 01 and/or the antenna 21 is already in the reset state (for example, state 2 in FIG. 2) when the second electric signal sent by the gas-electric conversion device is received.

Optionally, the second gas delivery device provided by the embodiment of the present disclosure is configured to deliver gas to the air inlet hole of the first radial air hole 1121, the second radial air hole 1122, and the third radial air hole 1123. It can be understood that, according to the present disclosure, the air outlet hole of the first radial hole 1121, the second radial hole 1122, and the third radial hole 1123 are configured to output the first or second air pressure (that is, the first or second air pressure signal) to the gas-electric conversion device.

The above embodiments are merely used for the convenience of describing the present disclosure and are not limited thereto. Without departing from the spirit of the present disclosure, various simple transformations and modifications made by those skilled in the art according to the scope and the specification of the present disclosure should be included in the scope of the present application.

What is claimed is:

1. A non-metallic position sensor for electromagnetic compatibility testing, comprising:
a cylinder body, a piston placed in the cylinder body, and a piston rod whose one end is fixedly connected with the piston; the cylinder body comprising a cylinder body upper chamber and a cylinder body lower chamber; a side wall of the cylinder body lower chamber being provided with a first radial air hole, a second radial air hole arranged on the lower end of the first radial air hole, and a third radial air hole arranged on the same horizontal plane as the first radial air hole;
a portion of the piston rod combined with the inner wall of the cylinder body lower chamber being provided with a first seal ring and a second seal ring in sequence from top to bottom, and the piston rod being provided with a breather pipe internally; an axial distance between the first seal ring and the second seal ring being equal to an axial distance between the first radial air hole and the second radial air hole; the first seal ring, the second seal ring, and the inner chamber of the cylinder body lower chamber being sealed and in clearance fit; and the first seal ring being provided with a first radial through hole, the second seal ring being provided with a second radial through hole.

2. The non-metallic position sensor for electromagnetic compatibility testing of claim 1, wherein the first radial air hole is communicated with the third radial air hole when the piston rod moves to a first position.

3. The non-metallic position sensor for electromagnetic compatibility testing of claim 1, wherein the end of the cylinder body upper chamber is provided with an axial air inlet hole, external airflow entering the cylinder body through the axial air hole and pushing the piston rod to move downward relative to the cylinder body; when the piston rod moves to a second position, a pipe mouth of the breather pipe, the first radial through hole, and the first radial air hole being communicated with each other, the other pipe mouth of the breather pipe, the second radial through hole, and the second radial air hole being communicated with each other, that is, the first radial air hole being communicated with the second radial air hole.

4. The non-metallic position sensor for electromagnetic compatibility testing of claim 1, wherein a portion of the piston combined with the inner wall of the cylinder body upper chamber is provided with a third seal ring, the third seal ring and the inner chamber of the cylinder body upper chamber being sealed and in clearance fit.

5. The non-metallic position sensor for electromagnetic compatibility testing of claim 1, wherein the inner wall of the cylinder body lower chamber is provided with a fourth seal ring and a fifth seal ring in sequence from top to bottom; one end of the piston rod being fixedly connected with the piston through a through hole formed on the fourth seal ring, the piston rod and the fourth seal ring being sealed and in clearance fit, and the other end passing through a through hole formed on the fifth seal ring, the piston rod and the fifth seal ring being sealed and in clearance fit.

6. The non-metallic position sensor for electromagnetic compatibility testing of claim 1, wherein the non-metallic position sensor for electromagnetic compatibility testing is non-metallic material.

7. A device for automatic antenna positioning, comprising an adapting piece, a rotary sleeve arranged on the adapting piece, an antenna arranged in the rotary sleeve, and a non-metallic position sensor of the claim 1 which is arranged on the adapting piece;

the adapting piece further comprising: a hollow cavity, a first mounting hole arranged inside the cavity and penetrating upper and lower surfaces of the adapting piece, and a second mounting hole arranged on the periphery of the cavity and penetrating upper and lower surfaces of the adapting piece;

the antenna being mounted in the first mounting hole with the rotary sleeve arranged outside, at least one end of the antenna extending out of the first mounting hole; wherein the rotary sleeve comprises an inner sleeve fixedly connected with the antenna, and an outer sleeve arranged outside of the inner sleeve; a surface of the inner sleeve near the outer sleeve being provided with an axial sliding slot, a surface of the outer sleeve near the inner sleeve being provided with a slider which is matched with the sliding slot and is placed in the sliding slot;

at least one end of the antenna extending out of the first mounting hole as a detecting end; the cylinder body of the non-metallic position sensor being arranged into the second mounting hole of the adapting piece, and one end of the piston rod of the non-metallic position sensor extending out of the second mounting hole; the antenna being configured to detect that one end of a test object is connected with the end of the piston rod of the non-metallic position sensor extending out of the second mounting hole through a connecting plate; the axial direction of the antenna being the same as the axial direction of the piston rod of the non-metallic position sensor, and an axial distance between the end of the piston rod extending out of the second mounting hole and the test object being equal to an axial distance between the end of the antenna and the test object.

8. The device for automatic antenna positioning of claim 7, wherein the antenna drives the piston rod of the non-metallic position sensor to rise relative to the cylinder body when the antenna rises relative to the adapting piece; and the first radial air hole being communicated with the third radial air hole when the antenna rises to a first position relative to the adapting piece.

9. The device for automatic antenna positioning of claim 7, wherein the device for automatic antenna positioning further comprises an antenna mount and a connecting arm connected to the antenna mount, wherein the adapting piece is connected to the connecting arm.

10. A system for automatic antenna positioning, comprising a device for automatic antenna positioning of claim 7, wherein the system further comprises a gas-electric conversion device connected with the non-metallic position sensor of the device for automatic antenna positioning, a position control device connected with the gas-electric conversion device; wherein the non-metallic position sensor of the device for automatic antenna positioning is configured to send a first air pressure signal to the gas-electric conversion device when the first radial air hole is communicated with the third radial air hole; the gas-electric conversion device being configured to convert the received first air pressure signal to a first electric signal and send the first electric signal to the position control device; and the position control device being configured to determine that the non-metallic position sensor and/or the antenna effectively touches a test object when receiving the first electric signal sent by the gas-electric conversion device.

11. The system for automatic antenna positioning of claim 10, wherein the non-metallic position sensor is configured to send a second air pressure signal to the gas-electric conversion device; and the gas-electric conversion device being configured to: convert the received second air pressure signal to a second electric signal and send the second electric signal to the position control device; and the position control device being configured to: determine that the non-metallic position sensor completes reset, and determine that the antenna can enter a test state, when receiving the second electric signal sent by the gas-electric conversion device.

12. The system for automatic antenna positioning of claim 10, wherein the system for automatic antenna positioning further comprises a second gas delivery device, the second gas delivery device being configured to supply gas to the cylinder body lower chamber of the non-metallic position sensor.

* * * * *